United States Patent
Hiratsuka

(10) Patent No.: US 8,889,445 B2
(45) Date of Patent: Nov. 18, 2014

(54) METHOD FOR MANUFACTURING SEMICONDUCTOR OPTICAL DEVICE AND SEMICONDUCTOR OPTICAL DEVICE

(75) Inventor: Kenji Hiratsuka, Yokohama (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 275 days.

(21) Appl. No.: 13/549,617

(22) Filed: Jul. 16, 2012

(65) Prior Publication Data
US 2013/0023077 A1    Jan. 24, 2013

(30) Foreign Application Priority Data
Jul. 22, 2011    (JP) .................................. 2011-161233

(51) Int. Cl.
| H01L 23/544 | (2006.01) |
| H01S 5/02 | (2006.01) |
| H01S 5/10 | (2006.01) |
| H01S 5/22 | (2006.01) |

(52) U.S. Cl.
CPC ............. *H01S 5/0202* (2013.01); *H01S 5/1082* (2013.01); *H01S 5/0203* (2013.01); *H01S 5/22* (2013.01)
USPC ......................................................... 438/31

(58) Field of Classification Search
CPC ... H01S 5/1082; H01S 5/2202; H01S 5/0202; G03F 9/708; G03F 9/7088
USPC ............................................................ 438/31
See application file for complete search history.

(56) References Cited

U.S. PATENT DOCUMENTS

| 7,924,897 B2 * | 4/2011 | Ohno ........................ 372/49.01 |
| 8,222,058 B2 * | 7/2012 | Ishihara .......................... 438/26 |
| 8,610,148 B2 * | 12/2013 | Nomaguchi ..................... 257/98 |

FOREIGN PATENT DOCUMENTS

JP    2010-267795    11/2010

* cited by examiner

*Primary Examiner* — John C Ingham
(74) *Attorney, Agent, or Firm* — Smith, Gambrell & Russell, LLP

(57) ABSTRACT

A method for manufacturing a semiconductor optical device includes the steps of growing a stacked semiconductor layer on a substrate having a cleavage direction in a first direction; forming a first mask having a plurality of openings arranged in the first direction; forming a mark array by etching the stacked semiconductor layer using the first mask; forming a second mask having first and second openings extending in a second direction intersecting the first direction; obtaining a substrate product by forming first and second grooves, and a waveguide mesa by etching the stacked semiconductor layer by using the second mask; and producing a laser diode bar by cleaving the substrate product including the waveguide mesa. First and second residual marks are formed on the upper surface of the waveguide mesa. First and second transfer marks are formed on the bottoms of the first and the second grooves, respectively.

12 Claims, 11 Drawing Sheets

METHOD FOR MANUFACTURING SEMICONDUCTOR OPTICAL DEVICE AND SEMICONDUCTOR OPTICAL DEVICE

BACKGROUND OF THE INVENTION

1. Field of the Invention

The present invention relates to a method for manufacturing a semiconductor optical device and a semiconductor optical device.

2. Description of the Related Art

In a device production process of a laser diode (LD), an end facet of a laser cavity is formed through cleavage. The cleavage is a working method taking advantage of the strength of interatomic bonding force depending on the lattice arrangement of a semiconductor crystal. For example, Japanese Unexamined Patent Application Publication No. 2010-267795 discloses a method for manufacturing a laser diode device, the method including the step of forming an end facet or a laser diode (LD) through cleavage. The end facet formed through the cleavage has an optical flatness.

SUMMARY OF THE INVENTION

A pair of cleaved facets of the laser diode (LD) form a reflection mirror of a laser cavity. The light generated in an optical cavity is amplified in the laser cavity and, thereafter, is reflected at the reflection mirror. Lasing occurs by repetition of the amplification and the reflection. The laser light is emitted from the reflection mirror of the laser cavity.

A substrate product is obtained by completing a wafer process. A large number of laser diodes (LDs) are arranged in the substrate product. The substrate product includes device areas which are arranged in a two-dimensional array. A laser diode bar (hereafter referred to as LD bar) is formed by cleaving the substrate product. For this purpose, scribing at intervals of a cavity length of the LD is performed on one end of the surface of the substrate product. Thereafter, the surface or the substrate product is pressed with a blade and, thereby, the LD bar is produced. If necessary, the substrate product may be cleaved into substrate pieces after performing scribing at an interval which is an integral multiple of the cavity length of the LD on the surface of the substrate product. In this case, the LD bar is formed by cleaving the substrate piece. The substrate product or the substrate piece is cleaved along the scribe line. The LD bar includes a plurality of LDs aligned side-by-side one-dimensionally. Then, the LD bar is divided into LD chips.

Cleavage occurs along the scribe line while propagating into the inside of the crystal. However, when the substrate product or substrate piece has an uneven surface on an extended line of the scribe line, a cleavage path of the semiconductor crystal changes in the vicinity of a cross point between the uneven surface and the extended line of the scribe line. As a result, an end facet of the LD chip may become out of the cleaved surface, so that a flat end facet may not be obtained. Such an end facet does not function as a reflection mirror of the laser cavity and, thereby, characteristics of the LD chip are degraded. Alternatively, a device yield is reduced because of defective end facet.

The present invention relates to a method for manufacturing a semiconductor optical device. This method includes the steps of (a) growing a stacked semiconductor layer on a substrate having a cleavage direction in a first direction; (b) forming a first mask having a plurality of openings arranged in the first direction on the stacked semiconductor layer; (c) forming a mark array by etching the stacked semiconductor layer using the first mask, the mark array including a first mark and a second mark; (d) after removing the first mask, forming a second mask having first and second openings extending in a second direction intersecting the first direction, the first opening having a first edge crossing the first mark, the second opening having a second edge crossing the second mark; (e) obtaining a substrate product by forming first and second grooves corresponding to the first and the second openings, respectively, and a waveguide mesa defined by the first and second grooves by etching the stacked semiconductor layer by using the second mask; and (f) producing a laser diode bar by cleaving the substrate product including the first and the second grooves and the waveguide mesa. In the step of forming the first and second grooves, first and second residual marks are formed on the upper surface of the waveguide mesa, the first and the second residual marks being formed from a part of the first and the second marks, respectively. In addition, a first transfer mark is formed on the bottom of the first groove, the first transfer mark being formed by transferring from a part of the first mark. A second transfer mark is formed on the bottom of the second groove, the second transfer mark being formed by transferring from a part of the second mark.

According to this method for manufacturing a semiconductor optical device, the first edge of the first opening of the second mask crosses the first mark in the mark array, and the second edge of the second opening of the second mask crosses the second mark in the mark array. Consequently, the first and the second residual marks are formed on the upper surface of the waveguide mesa from a part of the first and the second marks, respectively, by etching the stacked semiconductor layer using the second mask in the step of forming the first and the second grooves. The first and the second transfer marks are formed on the bottoms of the first and the second grooves, respectively, from a part of the first and the second marks, respectively. Therefore, the first and the second residual marks are aligned with the first and the second transfer marks, respectively. Cleavage is guided by the first and the second transfer marks and the first and the second residual marks. Consequently, cleavage can be performed along the first and the second transfer marks and the first and the second residual marks with good reproducibility and stability.

In the method for manufacturing a semiconductor optical device, according to the present invention, the stacked semiconductor layer preferably includes a first cladding layer, a core layer, and a second cladding layer which constitute a waveguide structure.

In the method for manufacturing a semiconductor optical device, according to the present invention, the waveguide mesa may have a width defined by an interval between the first edge of the first opening and the second edge of the second opening.

In the method for manufacturing a semiconductor optical device, according to the present invention, in the step of forming first and second grooves, the etching of the stacked semiconductor layer using the second mask is preferably performed by a reactive ion etching method by using a gas mixture of $CH_4/H_2$ as an etchant.

In the method for manufacturing a semiconductor optical device, according to the present invention, the first mark preferably has a portion partially exposed at the first opening and the second mask covers the remaining portion of the first mark. The second mark preferably has a portion partially exposed at the second opening and the second mask covers the remaining portion of the second mark. The partially exposed portion of the first mark preferably has an angle toward the first direction and, in addition, the remaining portion of the first mark preferably has an angle toward a third direction opposite to the first direction. The partially exposed portion of the second mark preferably has an angle toward the first direction and, in addition, the remaining portion of the second mark preferably has an angle toward the third direction.

According to this method for manufacturing a semiconductor optical device, the first and second marks have portions partially exposed at the first and the second openings, respectively. Therefore, the surface shapes of the regions exposed at the first and the second openings are transferred to the bottoms of the grooves while being maintained during etching. Furthermore, the second mask covers the remaining portions of the first and the second marks. Consequently, the surface shapes of the regions covered with the second mask are maintained without being etched. The directions of the angles with respect to the first and the second marks can guide the cleavage direction.

In the method for manufacturing a semiconductor optical device, according to the present invention, the laser diode bar preferably has a cleaved surface. The first transfer mark and the second transfer mark may be divided independently into first and second portions through the cleavage. The cleaved surface of the laser diode bar may have the first portion of the first transfer mark and the first portion of the second transfer mark. Furthermore, the first residual mark and the second residual mark may be divided independently into first and second portions through the cleavage. The cleaved surface of the laser diode bar may have the first portion of the first residual mark and the first portion of the second residual mark.

According to this method for manufacturing a semiconductor optical device, cleavage is guided by the first and the second transfer marks and the first and the second residual marks. At this time, each of the first transfer mark, the second transfer mark, the first residual mark, and the second residual mark actions as a local starting point of cleavage. Consequently, the first transfer mark and the second transfer mark are divided independently physically into the first and the second portions through the cleavage. The first residual mark and the second residual mark are divided independently physically into the first and the second portions.

In the method for manufacturing a semiconductor optical device, according to the present invention, the mark array may further include a third mark and a fourth mark. The first opening may have a third edge crossing the third mark in the mark array. The second opening may have a fourth edge crossing a fourth mark in the mark array. The third edge of the first opening is farther from the second opening than is the first edge of the first opening. The fourth edge of the second opening is farther from the first opening than is the second edge of the second opening.

According to this method for manufacturing a semiconductor optical device, the third edge of the first opening in the second mask crosses the third mark in the mark array. The fourth edge of the second opening in the second mask crosses a fourth mark in the mark array. Consequently, as with the first and the second marks, the transfer mark and the residual mark are formed from the third and the fourth marks. Cleavage can also be guided by them.

In the method for manufacturing a semiconductor optical device, according to the present invention, in the step of forming the first and the second grooves, first and second terraces are preferably formed. The first terrace and the waveguide mesa define the first groove. The second terrace and the waveguide mesa define the second groove. Third and fourth residual marks are formed on the upper surfaces of the first and the second terraces, respectively, the third and the fourth residual marks being formed from a part of the third and the fourth marks, respectively. Furthermore, a third transfer mark is formed on the bottom of the first groove, the third transfer mark being formed by transferring from a part of the third mark. A fourth transfer Mark is formed on the bottom of the second groove, the fourth transfer mark being formed by transferring a part of the fourth mark.

According to this method for manufacturing a semiconductor optical device, cleavage is guided by the third and the fourth transfer marks and the third and the fourth residual marks in addition to the first and the second transfer marks and the first and the second residual marks. Furthermore, each of the third transfer mark, the fourth transfer mark, the third residual mark, and the fourth residual mark actions as a local starting point of cleavage.

The method for manufacturing a semiconductor optical device, according to the present invention, may further include the step of forming a groove by scribing the surface of the stacked semiconductor layer in accordance with the mark array before cleaving the substrate product. Furthermore, the scribed groove preferably has a depth larger than the depths of the first and the second marks.

According to this method for manufacturing a semiconductor optical device, an initial starting point of cleavage can be formed through scribing at a desired position, as necessary.

In the method for manufacturing a semiconductor optical device, according to the present invention, the first and the second marks may have depths of 250 nm or more.

According to this method for manufacturing a semiconductor optical device, the first and the second transfer marks and the first and the second residual marks are formed from the first and the second marks having depths sufficient for guiding cleavage.

The method for manufacturing a semiconductor optical device, according to the present invention, may further include the step of forming an insulating layer on the first and the second residual marks and the first and the second transfer marks alter forming the first and the second grooves and before cleaving the substrate product.

According to this method for manufacturing a semiconductor optical device, the insulating layer covers the first and the second residual marks and the first and the second transfer marks. Therefore, contamination from the first and the second transfer marks disposed on the bottoms of the first and the second grooves, respectively, and the first and the second residual marks on the upper surface of the waveguide mesa can be avoided.

The method for manufacturing a semiconductor optical device, according to the present invention, may further include the steps of forming an opening in the insulating layer located on the upper surface of the waveguide mesa; and forming a first electrode in contact with the waveguide mesa through the opening before cleaving the substrate product.

According to this method for manufacturing a semiconductor optical device, the first electrode comes into contact with the waveguide mesa through the opening of the insulating layer.

DESCRIPTION OF THE PREFERRED EMBODIMENTS

Figure 1A:
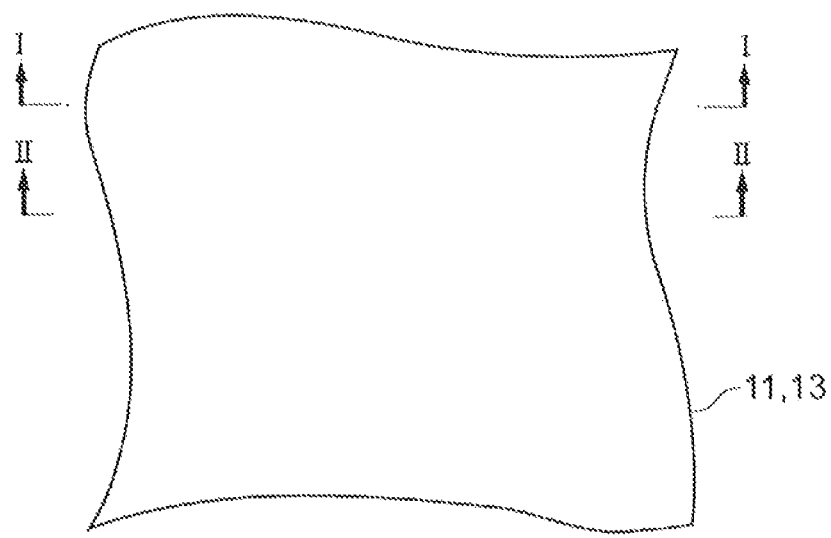
FIG. 1A is a plan view schematically illustrating a method for manufacturing a semiconductor optical device according to an embodiment of the present invention.

The embodiments of a method for manufacturing a semiconductor optical device and a semiconductor optical device according to the present invention will be described with reference to attached drawings. The same portions are indicated by the same reference numerals, where possible.

Figure 1B:
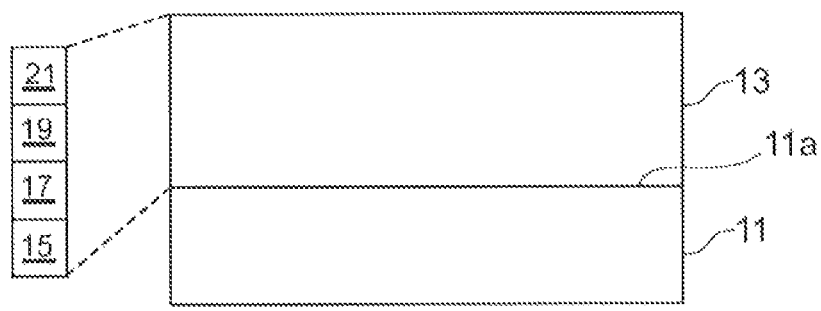
FIG. 1B shows a cross-section taken along a line I-I shown in FIG. 1A.
Figure 1C:
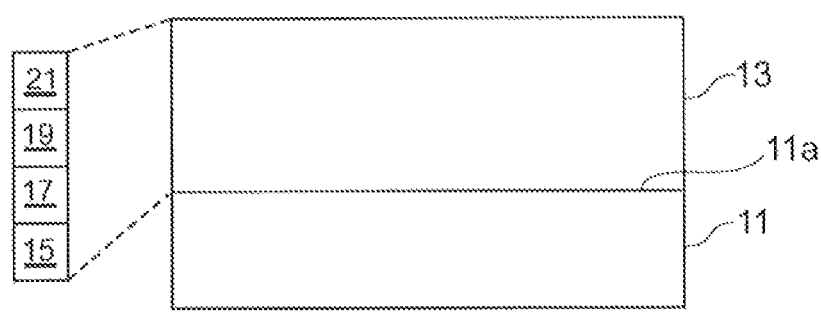
FIG. 1C shows a cross-section taken along a line II-II shown in FIG. 1A.
Figure 2A:
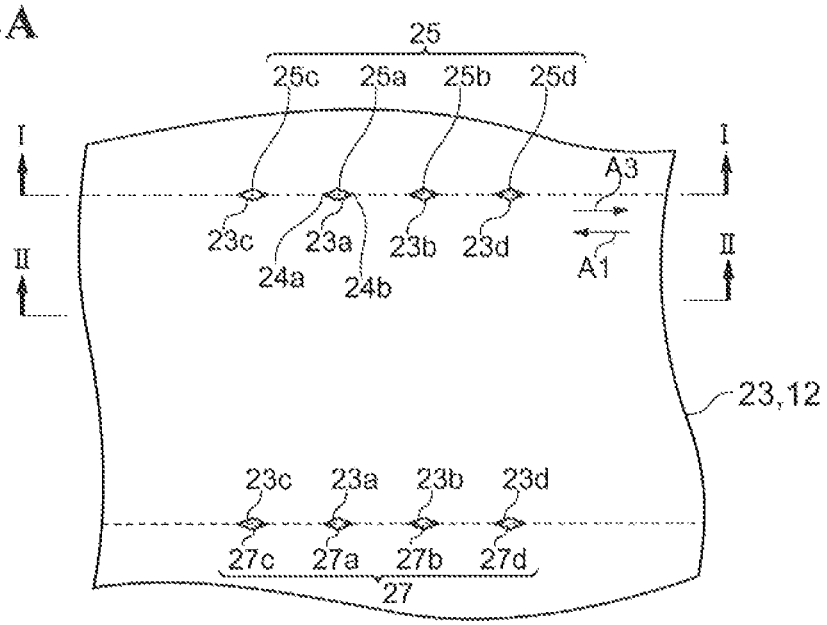
FIG. 2A is a plan view schematically illustrating a method for manufacturing a semiconductor optical device according to an embodiment of the present invention.
Figure 2B:
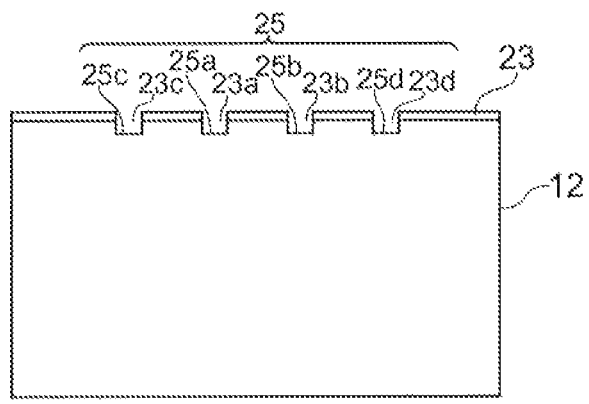
FIG. 2B shows a cross-section taken along a line I-I shown in FIG. 2A.
Figure 2C:
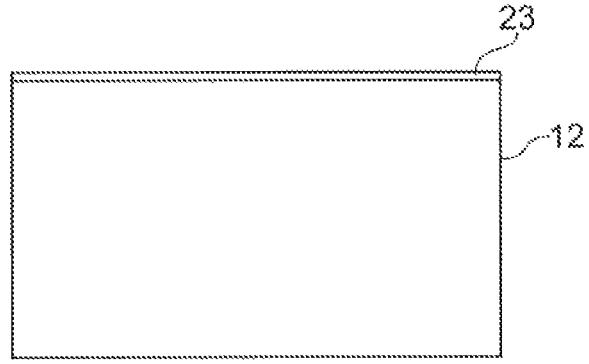
FIG. 2C shows a cross-section taken along a line II-II shown in FIG. 2A.

FIG. 1A is a plan view schematically illustrating a method for manufacturing a semiconductor optical device according to an embodiment of the present invention. FIG. 1B shows a cross-section taken along a line I-I shown in FIG. 1A. FIG. 1C shows a cross-section taken along a line II-II shown in FIG. 1A. The cross-section shown in FIG. 1B indicates the position at which an end facet of the semiconductor optical device is formed. The cross-section shown in FIG. 1C indicates an inside of the semiconductor optical device at a distance from the end facet of the device. Likewise, regarding FIGS. 2A to 2C, FIGS. 3A to 3C, FIGS. 4A to 4C, FIGS. 5A to 5C, FIGS. 6A to 6C, and FIGS. 7A to 7C, FIGS. 2A to 7A are plan views. FIGS. 2B to 7B show cross-sections taken along the lines I-I shown in FIGS. 2A to 7A, respectively. FIGS. 2C to 7C show cross-sections taken along the lines II-II shown in FIGS. 2A to 7A, respectively. The cross-sections shown in FIGS. 2B to 7B indicate the positions at which the end facet of the semiconductor optical device is formed. The cross-sections shown in FIGS. 2C to 7C indicate the inside of the semiconductor optical device at a distance from the end facet of the device.

In Step S100, a substrate (reference numeral 11 in FIG. 1B and FIG. 1C) is prepared. The substrate 11 has a crystal structure which can be cleaved in a predetermined direction. For example, the material for the substrate 11 is made from a III-V group compound semiconductor, e.g., InP or GaAs. The principal surface 11a of the substrate 11 can have a plane orientation of the (100) plane or in the vicinity of the (100) plane. In Step S101, as shown in FIGS. 1A to 1C, a stacked semiconductor layer 13 to form an optical waveguide is grown on the principal surface 11a of the substrate 11 by an epitaxial growth method. As for the growth method, for example, a metal-organic vapor phase epitaxy (MOVPE) method is used. The stacked semiconductor layer 13 includes a first cladding layer 15, a core layer 17, and a second cladding layer 19. The core layer 17 is disposed between the first cladding layer 15 and the second cladding layer 19. The first cladding layer 15, the core layer 17, and the second cladding layer 19 are stacked in the direction of the normal to the principal surface 11a of the substrate 11. When the semiconductor optical device is a light-emitting device, e.g., a laser diode (LD), the core layer includes, for example, an active layer. In the following explanations, a LD is produced as an example of the semiconductor optical device. The semiconductor optical device is not limited to the LD, but may be a semiconductor optical amplifier, a modulator, an optical receiver, an integrated device including them, or the like.

(Example Of Structure Of Stacked Semiconductor Layer 13)

Substrate 11: n-type InP

First cladding layer 15: n-type InP, thickness 500 nm

Active layer 17: GaInAsP (MQW structure), thickness 75 nm

Second cladding layer 19: p-type InP, thickness 1500 nm

Contact layer 21: p-type GaInAs and/or p-type GaInAsP, thickness 200 nm/200 nm

The substrate 11 and the stacked semiconductor layer 13 constitute semiconductor laminate 12.

In Step S102, a first mask (reference numeral 23 in FIGS. 2A to 2C) made from an insulating material is formed on the stacked semiconductor layer 13. The first mask 23 is made from a dielectric film of SiN, $SiO_2$, or the like. The first mask 23 is produced as described below, for example. Initially, an insulating layer is deposited on the stacked semiconductor layer 13. Thereafter, a resist mask is formed on the insulating layer. This resist mask has a plurality of openings arranged in a first direction indicated by an arrow A1. The first direction is made to agree with one of directions in which the substrate 11 and the stacked semiconductor layer 13 can be cleaved. For example, when the plane orientation of the principal surface of the substrate 11 is the (100) plane, the first direction A1 is the <0-11> direction. The insulating film is etched by using the resist mask, so that the first mask 23 made from the insulating material is formed. When the insulating layer is made from SiN, the insulating layer is wet etched using, for example, hydrofluoric acid as an etchant. The first mask 23 has a plurality of openings 23a, 23b, 23c, and 23d arranged in the first direction indicated by the arrow A1.

Subsequently, in Step S103, the stacked semiconductor layer 13 is etched by using the first mask 23, so that mark arrays 25 and 27 are formed. The etching is performed by, for example, a reactive ion etching method by using a gas mixture of CH$_4$/H$_2$ as an etchant. The mark arrays 25 and 27 include marks 25a, 25b, 25c, and 25d and marks 27a, 27b, 27c, and 27d shown in FIG. 2A and FIG. 2B. Each of the marks 25a to 25d and the marks 27a to 27d includes a concave portion disposed on the surface 12a of the semiconductor laminate 12 (the surface 13a of the stacked semiconductor layer 13). If the height difference of the concave portion is too large, the thickness of the resist is changed significantly. In this case, it may become difficult to form the mask width with a high degree of accuracy in the following step. Therefore, the depths of the marks 25a to 25d and the marks 27a to 27d are, for example, 250 nm or more and 500 nm or less. This depth is within the range of 10% to 20% of the height of the waveguide mesa. The interval between the mark array 25 and the mark array 27 indicates the pitch of cleavage of the semiconductor optical device. Consequently, the interval between the array of the marks 25a to 25d and the marks 27a to 27d indicates the length of the device in the length direction of the cavity. After the etching of the stacked semiconductor layer 13 is completed, the first mask 23 is removed. When the first mask 23 is made from, for example, SiN, the first mask 23 is removed by wet etching with hydrofluoric acid.

A part of the marks 25a to 25d and the marks 27a to 27d have angles (tips) toward the first direction indicated by an arrow A1. The remaining portions of the marks 25a to 25d and the marks 27a to 27d have angles (tips) toward the third direction, indicated by an arrow A3, opposite to the first direction. For example, the mark 25a has an angle 24a toward the first direction and an angle 24b toward the third direction. The directions of angles of the marks 25a to 25d and the marks 27a to 27d guide the cleavage direction. It is desirable that the direction of the angle of the mark is made to agree with a predetermined cleavage line (line indicated by a dotted line in FIG. 2A). Regarding these marks, the dimension (length) in the direction of the predetermined cleavage line is within the range of 0.2 to 0.4 µm. The dimension (width) in the direction orthogonal to the predetermined cleavage line is 0.4 µm or less. It is preferable that the above-described length is larger than or equal to the above-described width. It is preferable that the shape of the mark is symmetric with respect to the predetermined cleavage line. In the present embodiment, the two-dimensional shapes of the marks 25a to 25d and the marks 27a to 27d are rhombus in the drawing. However, the shape of the mark is not limited to this, and may be, for example, a hexagon. Even in the case of the hexagon, one straight line passes through two vertexes and, therefore, the straight line can be made to agree with the predetermined cleavage line.

In Step S104, after the first mask 23 is removed, a second mask (reference numeral 29 shown in FIGS. 3A to 3C) is formed. The second mask 29 is made from a dielectric film of SiN, SiO$_2$, or the like. The second mask 29 has first and second openings 29a and 29b disposed in such a way as to define a waveguide mesa. Each of the first and the second openings 29a and 29b is extended in a second direction A2 orthogonal to the first direction A1. For example, when the plane orientation of the principal surface of the substrate 11 is the (100) plane, the second direction A2 is the <011> direction. The first opening 29a of the second mask 29 is defined by an edge 29c and an edge 29d. The second opening 29b of the second mask 29 is defined by an edge 29e and an edge 29f. In the embodiment, the edges 29c and 29d of the first opening 29a are a first edge and a third edge, respectively. Similarly, in the embodiment, the edges 29e and 29f of the second opening 29b are a second edge and a fourth edge, respectively. Regarding the second mask 29, the interval between the edge 29c of the first opening 29a and the edge 29e of the second opening 29b defines the waveguide mesa width DMS.

Figure 3A:
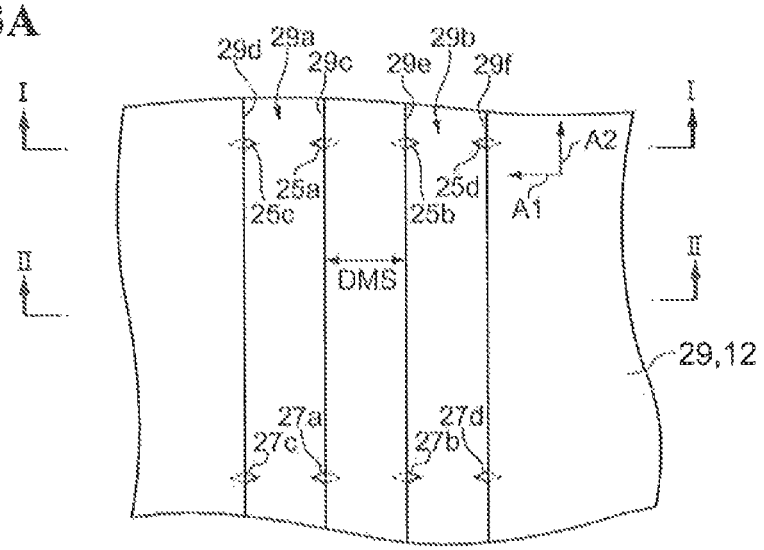
FIG. 3A is a plan view schematically illustrating a method for manufacturing a semiconductor optical device according to an embodiment of the present invention.

As shown in FIG. 3A, regarding the second mask 29, the edge 29c of the first opening 29a crosses the mark 25a in the mark array 25. Furthermore, the edge 29c of the first opening 29a crosses the mark 27a in the mark array 27. Regarding the second mask 29, the edge 29e of the second opening 29b crosses the mark 25b in the mark array 25. Furthermore, the edge 29e of the second opening 29b crosses the mark 27b in the mark array 27.

As shown in FIG. 3A, regarding the second mask 29, the edge 29d of the first opening 29a crosses the mark 25c in the mark array 25. Furthermore, the edge 29d of the first opening 29a crosses the mark 27c in the mark array 27. The edge 29f of the second opening 29b crosses the mark 25d in the mark array 25. Furthermore, the edge 29f of the second opening 29b crosses the mark 27d in the mark array 27.

The edge 29c of the first opening 29a crosses the marks 25a and 27a and, therefore, a part of the marks 25a and 27a are exposed at the first opening 29a. Meanwhile, the remaining portions of the marks 25a and 27a are covered with the second mask 29. The edge 29d of the first opening 29a crosses the marks 25c and 27c and, therefore, a part of the marks 25c and 27c are exposed at the first opening 29a. Meanwhile, the remaining portions of the marks 25c and 27c are covered with the second mask 29.

The edge 29e of the second opening 29b crosses the marks 25b and 27b and, therefore, a part of the marks 25b and 27b are exposed at the second opening 29b. Meanwhile, the remaining portions of the marks 25b and 27b are covered with the second mask 29. The edge 29f of the second opening 29b crosses the marks 25d and 27d and, therefore, a part of the marks 25d and 27d are exposed at the second opening 29b. Meanwhile, the remaining portions of the marks 25d and 27d are covered with the second mask 29.

Figure 4A:
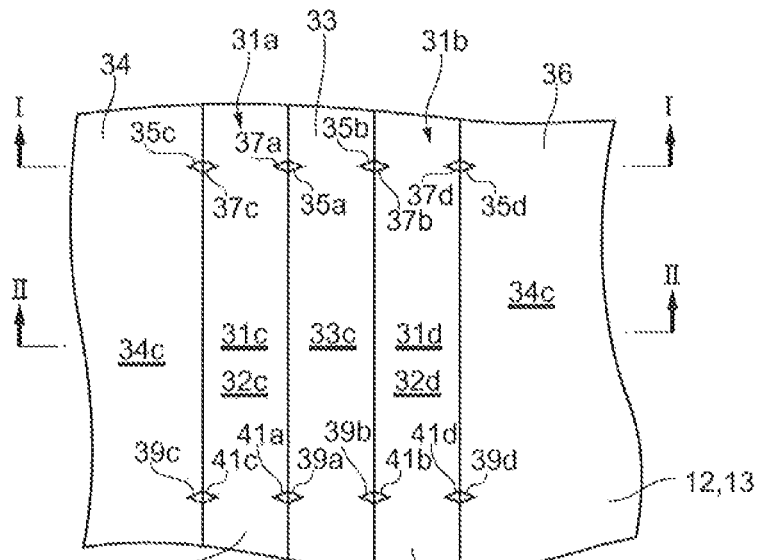
FIG. 4A is a plan view schematically illustrating a method for manufacturing a semiconductor optical device according to an embodiment of the present invention.
Figure 4B:
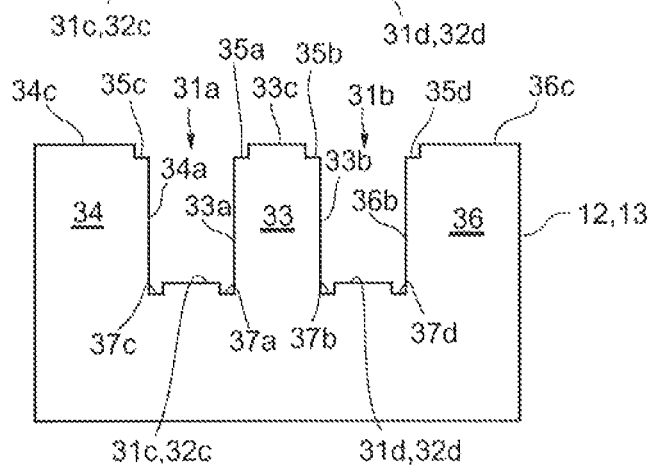
FIG. 4B shows a cross-section taken along a line I-I shown in FIG. 4A.
Figure 4C:
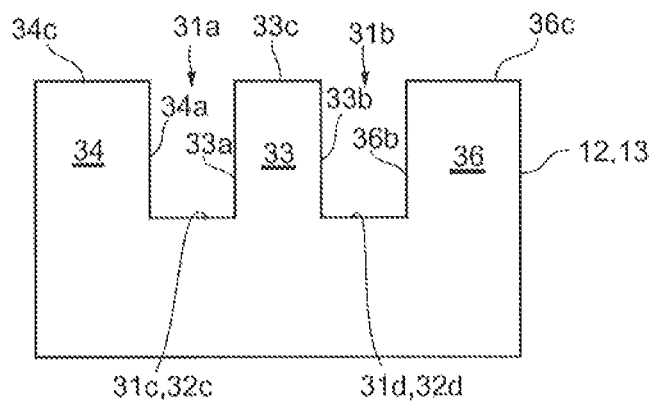
FIG. 4C shows a cross-section taken along a line II-II shown in FIG. 4A.

In Step S105, as shown in FIGS. 4A to 4C, the semiconductor laminate 12 (stacked semiconductor layer 13) is etched by a dry etching method by using the second mask 29, so that waveguide mesas 33, 34, and 36 are formed. Regarding the etching by the dry etching method, for example, a reactive ion etching method is used, in which a gas mixture of CH$_4$/H$_2$ is used as an etchant. The waveguide mesa 33 is formed in accordance with the first and the second openings 29a and 29b of the second mask 29. The height of the waveguide mesa 33 is, for example, 3.5 µm. The width of the waveguide mesa 33 is, for example, 12 µm. The widths of the grooves (in the present embodiment, first and second grooves 31a and 31b described later) formed in accordance with the first and the second openings 29a and 29b of the second mask 29 are, for example, 5 µm. The waveguide mesa 33 includes the first cladding layer 15, the core layer, and the second cladding layer 19. The core layer includes an active layer 17 which emits light in response to injection of a carrier. In this case, an appropriate cleaved surface can be provided to the light-emitting device. The waveguide mesa 33 can further include a contact layer 21. The contact layer 21 is disposed on a top surface of the waveguide mesa 33. In this embodiment, the contact layer 21 is disposed on the second cladding layer 19. The waveguide mesa 33 is formed through etching of the semiconductor laminate 12 (stacked semiconductor layer 13) exposed at the first and the second openings 29a and 29b. The waveguide mesa 33 has first and second etched surfaces 33a and 33b and an upper surface 33c formed through the etching. The waveguide mesa 33 is protruded from base surfaces 32c and 32d formed through the etching. After etching the semiconductor laminate 12 (stacked semiconductor layer 13) using dry etching, the second mask 29 is removed. When the second mask 29 is made from, for example, SiN, the second mask 29 is removed by wet etching with hydrofluoric acid.

A first residual mark 35a and a second residual mark 35b are formed on the upper surface 33c of the waveguide mesa 33. The first and the second residual marks 35a and 35b are formed from a part of the first and the second marks 25a and 25b (portions covered with the mask 29), respectively, through dry etching.

A first transfer mark 37a is formed on the base surface 32c. Regarding the first transfer mark 37a, a part of the first mark 25a (portion not covered with the mask 29) is dry-etched and, therefore, is finally transferred to the base surface 32c. As a result, a part of the first mark 25a (portion not covered with the mask 29) is converted to the first transfer mark 37a by etching the semiconductor laminate 12 (stacked semiconductor layer 13) using dry etching.

A second transfer mark 37b is formed on the base surface 32d. Regarding the second transfer mark 37b, a part of the second mark 25b (portion not covered with the mask 29) is dry-etched and, therefore, is filially transferred to the base surface 32d. As a result, a part of the second mark 25b (portion not covered with the mask 29) is converted to the second transfer mark 37b by etching the semiconductor laminate 12 (stacked semiconductor layer 13) using dry etching.

A first residual mark 39a and a second residual mark 39b are formed on the upper surface 33c of the waveguide mesa 33. The first and the second residual marks 39a and 39b are formed from a part of the first and the second marks 27a and 27b (portions covered with the mask 29), respectively, through dry etching.

A first transfer mark 41a is formed on the base surface 32c. Regarding the first transfer mark 41a, a part of the first mark 27a (portion not covered with the mask 29) is thy-etched and, therefore, is finally transferred to the base surface 32c. As a result, a part of the first mark 27a (portion not covered with the mask 29) is converted to the first transfer mark 41a by etching the semiconductor laminate 12 (stacked semiconductor layer 13) using dry etching.

A second transfer mark 41b is formed on the base surface 32d. Regarding the second transfer mark 41b, a part of the second mark 27b (portion not covered with the mask 29) is dry-etched and, therefore, is finally transferred to the base surface 32d. As a result, a part of the second mark 27b (portion not covered with the mask 29) is converted to the second transfer mark 41b by etching the semiconductor laminate 12 (stacked semiconductor layer 13) using dry etching.

These transfer marks and residual marks guide the direction of cleavage performed in a downstream step. It is preferable that the depths of the residual marks on the waveguide mesa 33 are 250 nm or more. It is preferable that the depths of the transfer marks on the base surfaces 32c and 32d are 250 nm or more. In order to guide the cleavage, the transfer marks and the residual marks are formed from the first and the second marks having sufficient depths.

In the present embodiment, the first and the second grooves (trenches) 31a and 31b are formed in one device area. The first and the second grooves 31a and 31b are formed in accordance with the first and the second openings 29a and 29b, respectively, of the second mask 29. The first and the second grooves 31a and 31b define the waveguide mesa 33. The bottoms 31c and 31d of the first and the second grooves 31a and 31b are in accordance with the base surfaces 32c and 32d, respectively.

When the first and the second grooves 31a and 31b are formed through dry etching by using the mask 29, terraces 34 and 36 are formed together with the waveguide mesa 33. The terraces 34 and 36 have etched side surfaces 34a and 36b, respectively, and upper surfaces 34c and 36c, respectively. The waveguide mesa 33 and the terrace 34 define the first groove 31a. The waveguide mesa 33 and the terrace 36 define the second groove 31b.

A third residual mark 35c is formed on the upper surface 34c of the terrace 34. A fourth residual mark 35d is formed on the upper surface 36c of the terrace 36. A third residual mark 39c is formed on the upper surface 34c of the terrace 34. A fourth residual mark 39d is formed on the upper surface 36c of the terrace 36.

The third transfer mark 37c and the fourth transfer mark 37d are formed on the bottom 31c of the first groove 31a and the bottom 31d of the second groove 31b, respectively. Regarding the third transfer mark 37c and the fourth transfer mark 37d, a part of the third mark 25c and the fourth mark 25d (portion not covered with the mask 29) are dry-etched and, therefore, are finally transferred to the bottom 31c of the first groove 31a and the bottom 31d of the second groove 31b, respectively.

The third transfer mark 41c and the fourth transfer mark 41d are formed on the bottom 31 c of the first groove 31a and the bottom 31d of the second groove 31b, respectively. Regarding the third transfer mark 41c and the fourth transfer mark 41d, a part of the third mark 27c and the fourth mark 27d (portion not covered with the mask 29) are dry-etched and, therefore, are finally transferred to the bottom 31c or the first groove 31a and the bottom 31d of the second groove 31b, respectively.

The residual marks (35c, 35d, 39c, and 39d) on the terraces 34 and 36 and the transfer marks (37c, 37d, 41c and 41d) on the bottoms 31c and 31d of the grooves 31a and the 31b in addition to the residual marks (35a, 35b, 39a and 39b) on the waveguide mesa 33 and the transfer marks (37a, 37b, 41a and 41b) on the base surfaces 32c and 32d guide cleavage- and each of these transfer marks and residual marks action as a local starting point of cleavage.

Figure 5A:
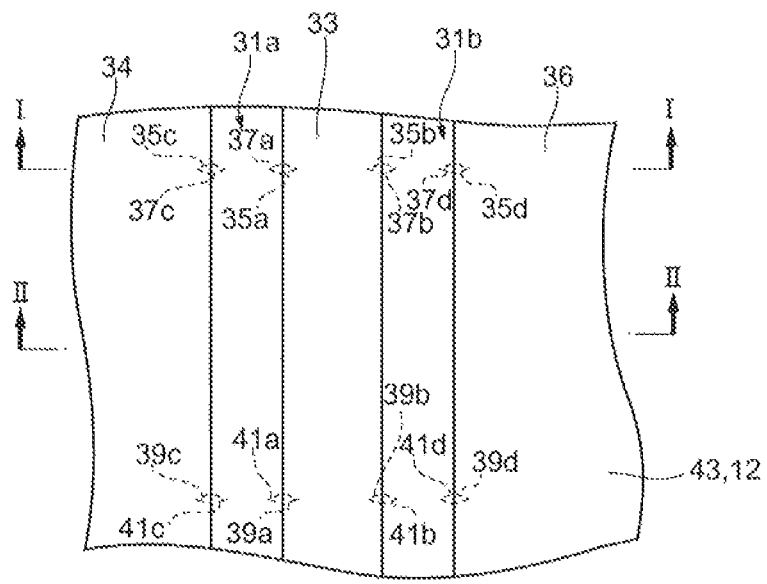
FIG. 5A is a plan view schematically illustrating a method for manufacturing a semiconductor optical device according to an embodiment of the present invention.
Figure 5B:
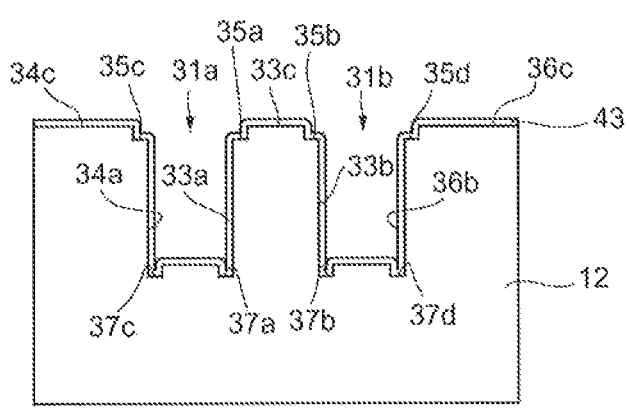
FIG. 5B shows a cross-section taken along a line I-I shown in FIG. 5A.
Figure 5C:
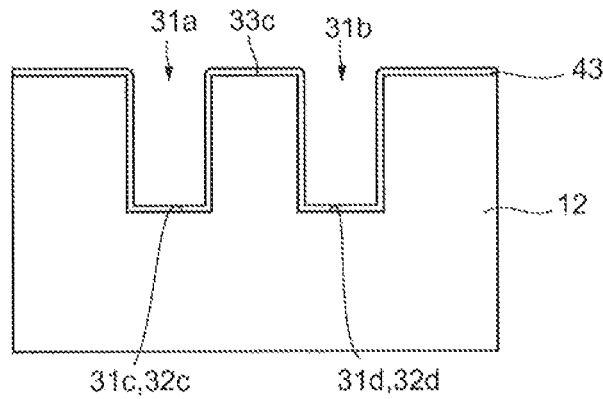
FIG. 5C shows a cross-section taken along a line II-II shown in FIG. 5A.

In Step S106, as shown in FIGS. 5A to 5C, an insulating layer 43 is formed all over the surface after the first and the second grooves 31a and 31b are formed and prior to cleavage. The insulating layer 43 is made from, for example, a dielectric film of SiN, $SiO_2$, or the like. The insulating layer 43 is formed on the waveguide mesa side surfaces 33a and 33b and upper surface 33c, the groove bottoms 31c and 31d (base surfaces 32c and 32d), and the terrace side surfaces 34a and 36b. The insulating layer 43 can cover the residual marks 35a, 35b, 35c, and 35d, the residual marks 39a, 39b, 39c, and 39d, the transfer marks 37a, 37b, 37c, and 37d, and the transfer marks 41a, 41b, 41c, and 41d. When the insulating layer 43 covers the residual marks 35a to 35d and 39a to 39d and the transfer marks 37a to 37d and 41a to 41d, contamination from these residual marks (35a to 35d and 39a to 39d) and these transfer marks (37a to 37d and 41a to 41d) can be avoided. Meanwhile, wet etching may be performed after the first and the second grooves 31a and 31b are formed and before the insulating layer 43 is formed. A damaged layer induced in dry etching process can be removed through this wet etching. Regarding this wet etching, for example, a mixed solution of hydrochloric acid, acetic acid, hydrogen peroxide, and water can be used as an etchant.

Figure 6A:
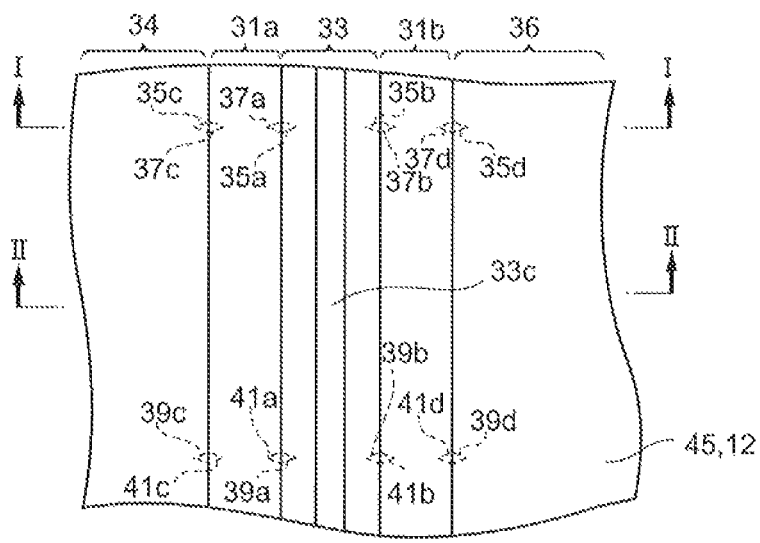
FIG. 6A is a plan view schematically illustrating a method for manufacturing a semiconductor optical device according to an embodiment of the present invention.
Figure 6B:
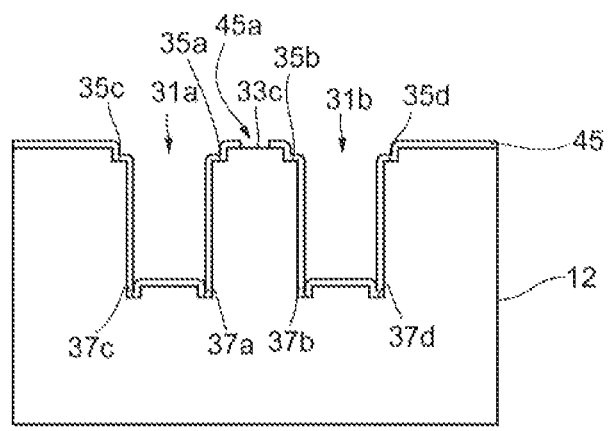
FIG. 6B shows a cross-section taken along a line I-I shown in FIG. 6A.
Figure 6C:
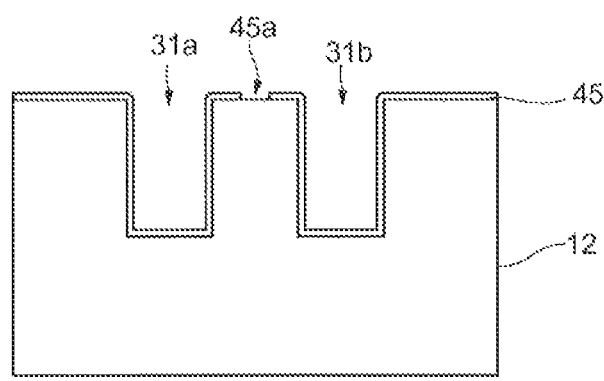
FIG. 6C shows a cross-section taken along a line II-II shown in FIG. 6A.

Then, an electrode is formed. In Step S107, as shown in FIGS. 6A to 6C, an opening 45a located on the upper surface 33c of the waveguide mesa 33 is formed in the insulating layer 43 before performing cleavage. In this manner, a protective film 45 is formed. The opening 45a in the insulating layer 43 is formed by using, for example, photolithography and etching processes. After formation of the opening as well, the protective film 45 covers the residual marks 35a, 35b, 35c, and 35*d*, the residual marks 39*a*, 39*b*, 39*c*, and 39*d*, the transfer marks 37*a*, 37*b*, 37*c*, and 37*d*, and the transfer marks 41*a*, 41*b*, 41*c*, and 41*d*.

Figure 7A:
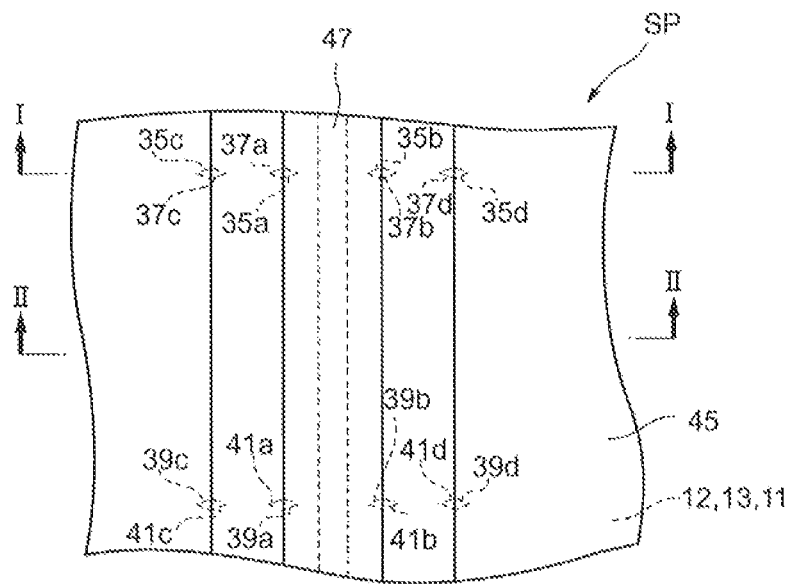
FIG. 7A is a plan view schematically illustrating a method for manufacturing a semiconductor optical device according to an embodiment of the present invention.
Figure 7B:
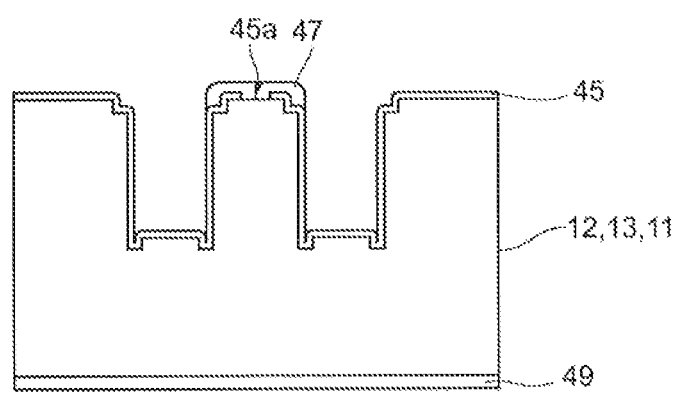
FIG. 7B shows a cross-section taken along a line I-I shown in FIG. 7A.
Figure 7C:
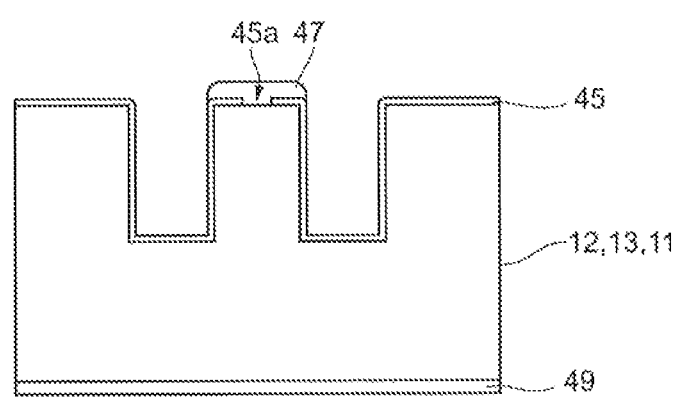
FIG. 7C shows a cross-section taken along a line II-II shown in FIG. 7A.

In Step S108, as shown in FIGS. 7A to 7C, a first electrode 47 (ohmic electrode) in contact with the surface of the waveguide mesa 33 through the opening 45*a* is formed. When the insulating layer 43 is formed covering the residual marks 35*a* to 35*d* and 39*a* to 39*d* and the transfer marks 37*a* to 37*d* and 4 la to 4I d, the protective film 45 covers the residual marks 35*a* to 35*d* and 39*a* to 39*d* and the transfer marks 37*a* to 37*d* and 41*a* to 41*d*. The first electrode 47 is in direct contact with the upper surface 33*c* of waveguide mesa 33 through the opening 45*a* in the protective film 45 and constitutes an ohmic electrode.

In Step S109, a second electrode 49 (ohmic electrode) in contact with the surface of the substrate 11 is formed. It is preferable that the back surface of the substrate is polished to reduce the substrate thickness prior to formation of the second electrode 49, as necessary. Consequently, the substrate is cleaved easily. For example, an InP substrate having a thickness of about 100 μm can be produced by polishing an InP substrate having a thickness of 350 μm. The wafer process is completed by these steps and a substrate product SP is obtained. The substrate product SP includes the first and the second grooves 31*a* and 31*b* and the waveguide mesa 33. The substrate product SP further includes the first electrode 47 and the second electrode 49.

Figure 8:
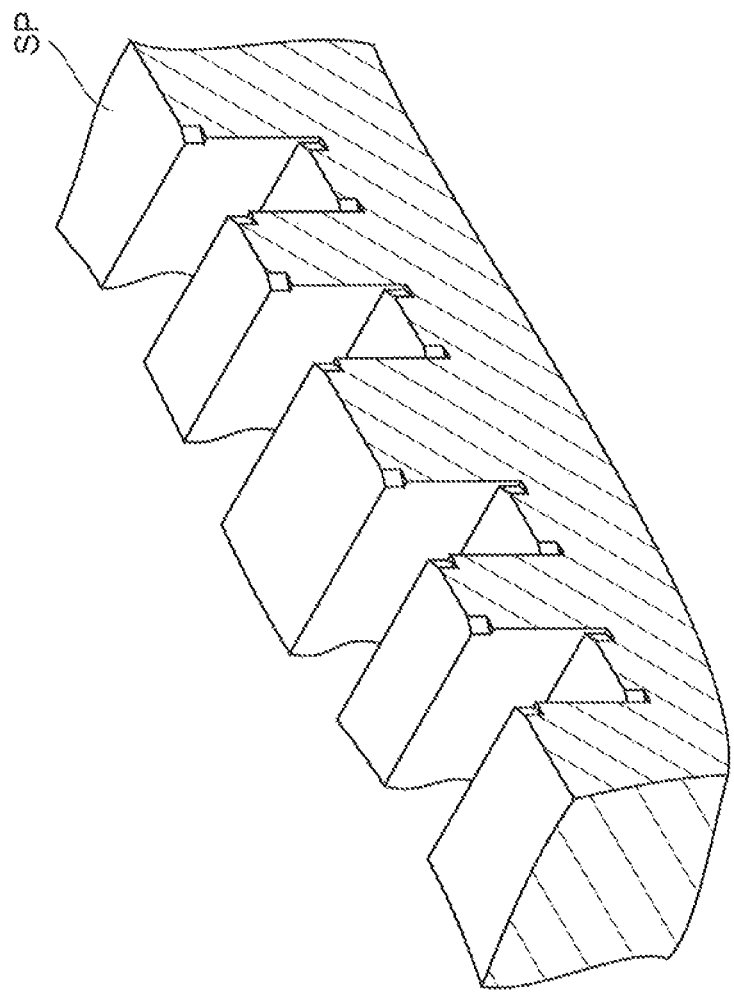
FIG. 8 is a diagram showing a substrate product SP to form a LD bar BAR.

Next, the outline of cleavage procedure will be described. The substrate product SP, for example, has a square or rectangular shape. The substrate product SP has device areas arranged in the shape of a two-dimensional array. A plurality of LD bars can be produced from the substrate product SP. FIG. 8 is a diagram showing a cross-section of the substrate product SP. If necessary, the substrate product SP may be cleaved into substrate pieces along a predetermined cleavage line, for example.

In Step S110, as necessary, for example, a V-shaped groove can he formed on the surface of the substrate product SP in accordance with the residual mark line and the transfer mark line by using, for example, a diamond scribe tool before the substrate product SP is cleaved into the LD bars. This scribed groove is formed on the surface 13*a* of the stacked semiconductor layer 13. It is preferable that the depth of the scribed groove is larger than the depths of the residual mark and the transfer mark. The initial starting point of cleavage can be formed at a desired position by forming the scribed groove.

Figure 9:
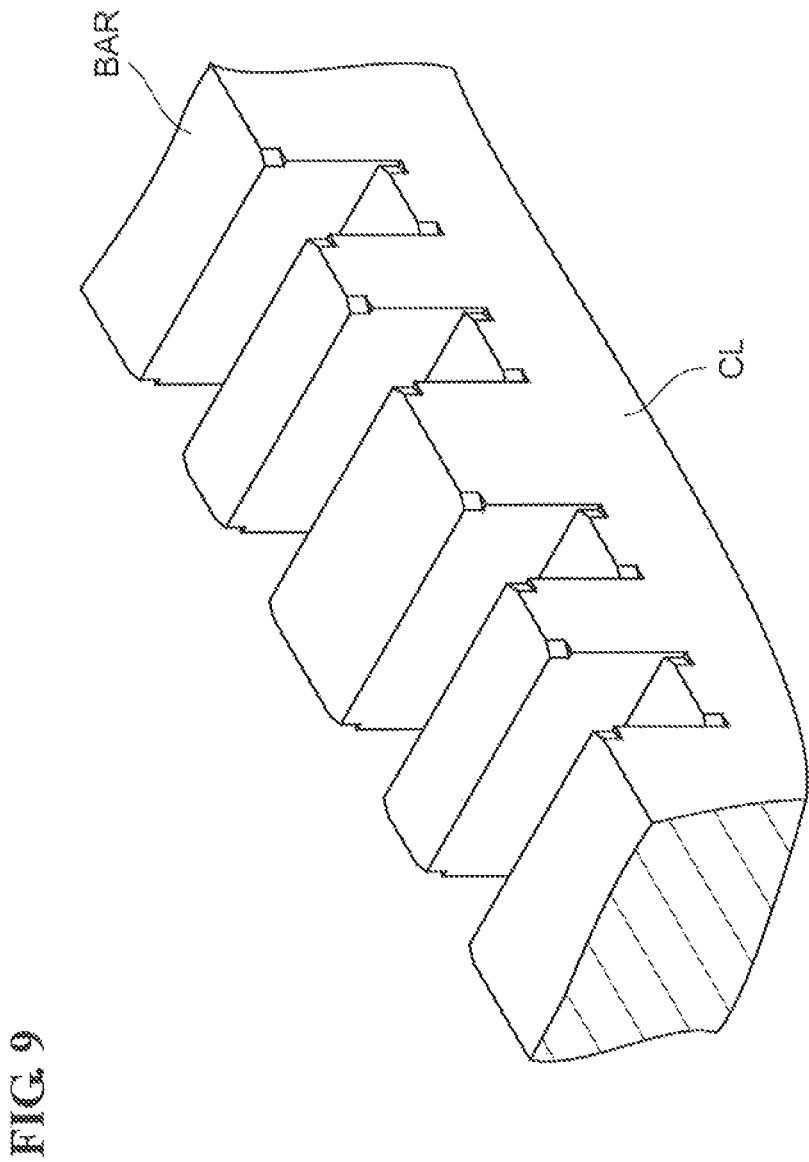
FIG. 9 is a diagram showing a LD bar BAR and a cleaved surface CL.

In Step S111, the LD bar BAR shown in FIG. 9 is produced by cleaving the substrate product SP along a predetermined cleavage line. The LD bar BAR has a cleaved surface CL. FIG. 9 shows a partially schematic perspective view of the LD bar BAR. As is shown in FIG. 9, a terrace, a groove, a waveguide mesa, a groove, a terrace, a groove; a waveguide mesa, a groove, and a terrace are arranged in a direction parallel to the predetermined cleavage line. In one embodiment, it is favorable that the substrate product SP is sandwiched between sheets having flexibility prior to cleavage. In order to form the LD bar, initially the back surface of the substrate product SP is protected with an adhesive tape. Thereafter, the substrate product SP is placed on a stage in such a way that the surface of the substrate product SP is opposed to the stage surface having a V-shaped concave portion. Subsequently, the back of the cleavage position (the back of the substrate product) is pressed with a blade (edge type tool) from above the adhesive tape. In this manner, the substrate product SP is cleaved along the predetermined cleavage line, so that a LD bar is formed.

Figure 3B:
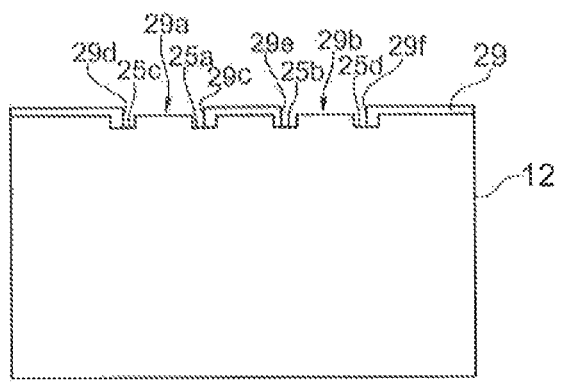
FIG. 3B shows a cross-section taken along a line I-I shown in FIG. 3A.
Figure 3C:
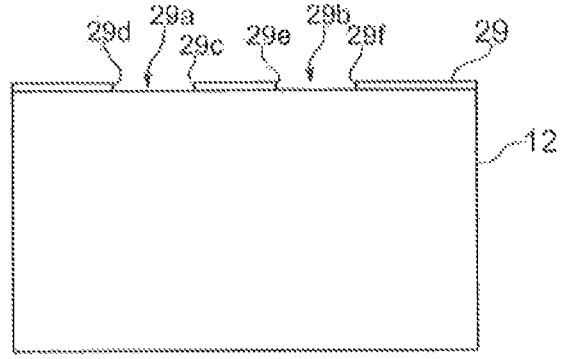
FIG. 3C shows a cross-section taken along a line II-II shown in FIG. 3A.

According to this method for manufacturing a semiconductor optical device, as shown in FIGS. 3A to 3C, the edge 29*c* of the first opening 29*a* in the second mask 29 crosses the mark 25*a* in the mark array 25. Furthermore, the edge 29*e* of the second opening 29*b* crosses the mark 25*b* in the mark array 25. Therefore, as shown in FIGS. 4A to 4C, the residual marks 35*a* and 35*b* are formed on the upper surface 33*c* of the waveguide mesa 33 from a part of the marks 25*a* and 25*b*, respectively, by forming the first and the second grooves 31*a* and 31*b* through dry etching. The transfer marks 37*a* and 37*b* are formed on the bottoms 31*c* and 31*d*, respectively, of the first and the second grooves 31*a* and 31*b*, respectively, from a part of the marks 25*a* and 25*b*. Consequently, the residual marks 35*a* and 35*b* are aligned with the transfer marks 37*a* and 37*b*, respectively. Cleavage is guided by disposing the residual marks 35*a* and 35*b* and the transfer marks 37*a* and 37*b*. As a result, cleavage can be performed along the residual marks 35*a* and 35*b* and the transfer marks 37*a* and 37*b*. The starting points of cleavage at an upper end 3 of the waveguide mesa 33 (residual marks 35*a* and 35*b*) agree with the starting points of cleavage at the bottoms 31*e* and 31*d* of the first and the second grooves 31*a* and 31*b* (transfer marks 37*a* and 37*b*), respectively. Furthermore, the width and the shape of the waveguide mesa are not reduced nor changed at the position of the core layer or the active layer even when these marks are formed.

Figure 10:
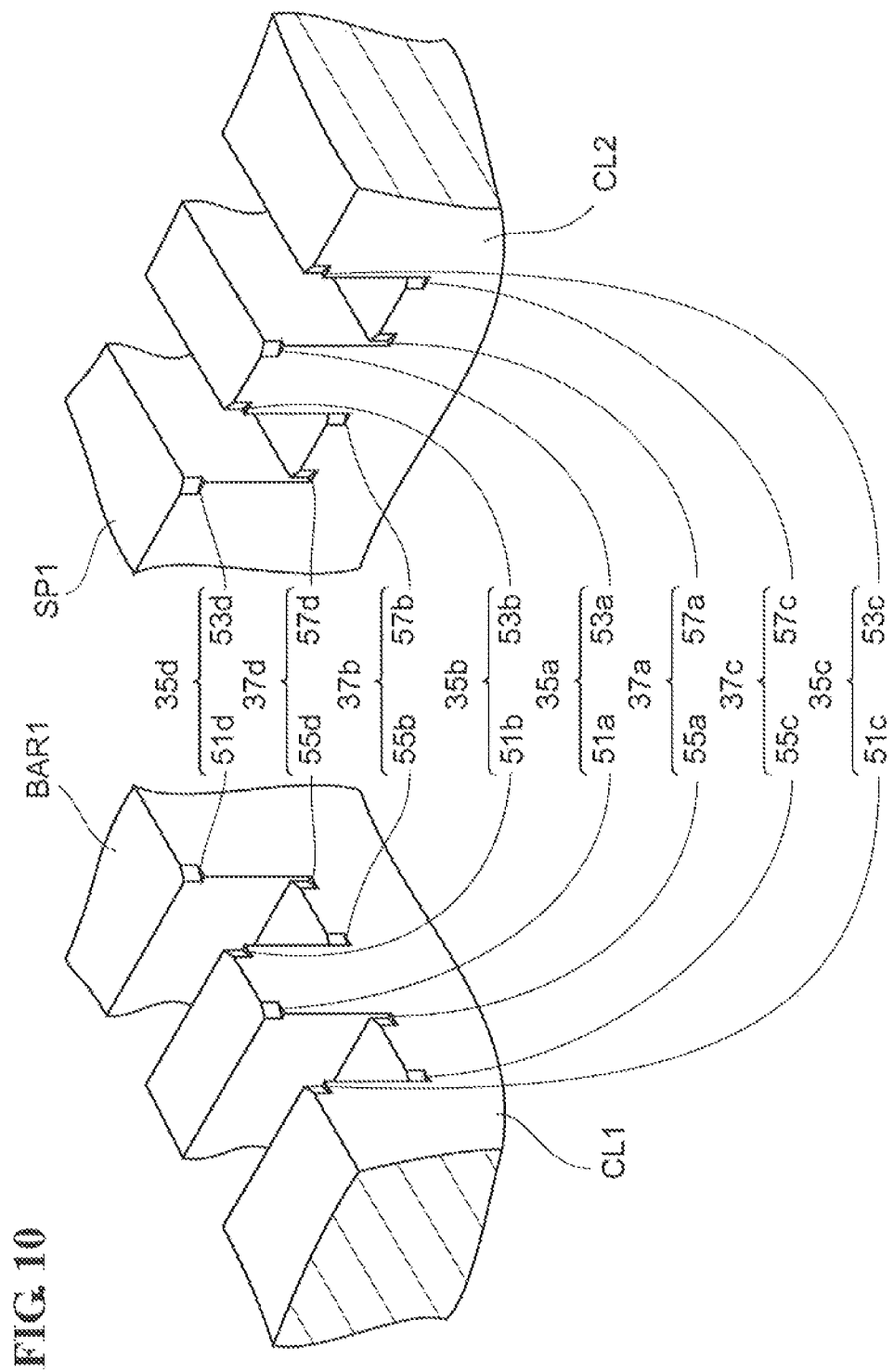
FIG. 10 is a diagram showing a LD bar BAR1 and a new substrate product SP1 produced through cleavage.

FIG. 10 is a diagram showing a LD bar BAR1 and a new substrate product SP1 produced through cleavage. The LD bar BAR1 and the new substrate product SP1 have cleaved surfaces CL1 and CL2, respectively, which are produced through one time of cleavage. As shown in FIG. 10, a terrace, a groove, a waveguide mesa, a groove, and a terrace are arranged in a direction parallel to the cleaved surfaces CL1 and CL2. The individual grooves reach the cleaved surfaces CL. Likewise, the individual waveguide mesas reach the cleaved surfaces CL. Furthermore, the individual terraces reach the cleaved surfaces CL. The transfer marks and the residual marks are exposed at the cleaved surfaces CL1 and CL2. The cleaved surface is formed along the transfer marks and the residual marks. Regarding the waveguide mesa, the width and the shape at the height of the active layer or the core layer are not influenced nor changed by disposition of the marks.

The first residual mark 35*a* is separated into a first portion (in the present embodiment, a first dent 51*a*) and a second portion (in the present embodiment, a second dent 53*a*) through this cleavage. The second residual mark 35*b* is separated into a first dent 51*b* and a second dent 53*b*. The first transfer mark 37*a* is separated into a first dent 55*a* and a second dent 57*a*. The second transfer mark 37*b* is separated into a first dent 55*b* and a second dent 57*b*. The cleaved surface CL1 of the LD bar BAR 1 has the first dents 51*a* and 51*b* from the residual marks and the first dents 55*a* and 55*b* from the transfer marks. The cleaved surface CL2 of the new substrate product SP1 has the second dents 53*a* and 53*b* from the residual marks and the second dents 57*a* and 57*b* from the transfer marks.

The third residual mark 35*c* is separated into a first dent 51*c* and a second dent 53*c* through this cleavage. The fourth residual mark 35*d* is separated into a first dent 55*b* and a second dent 53*d*. The third transfer mark 37*c* is separated into a first dent 55*c* and a second dent 57*c*. The fourth transfer mark 37*d* is separated into a first dent 55*d* and a second dent 57*d*. The cleaved surface CL1 of the LD bar BAR1 has the first dents 51*c* and 51*d* from the residual marks and the first dents 55*c* and 55*d* from the transfer marks. The cleaved surface CL2 of the new substrate product SP1 has the second dents 53c and 53d from the residual marks and the second dents 57c and 57d from the transfer marks.

According to this manufacturing method, the individual transfer marks 37a and 37b and the individual residual marks 35a and 35b action as local starting points of cleavage. Furthermore, the transfer marks 37a and 37b and the residual marks 35a and 35b guide the cleavage and, thereby, cleavage can be performed along these transfer marks 37a and 37b and residual marks 35a and 35b with reliability and good reproducibility. Consequently, the transfer mark 37a is physically separated into the first dent 55a and the second dent 57a through cleavage. The transfer mark 37b is physically separated into the first dent 55b and the second dent 57b. The residual mark 35a is physically separated into the first dent 51a and the second dent 53a. The residual mark 35b is physically separated into the first dent 51b and the second dent 53b.

Figure 11:
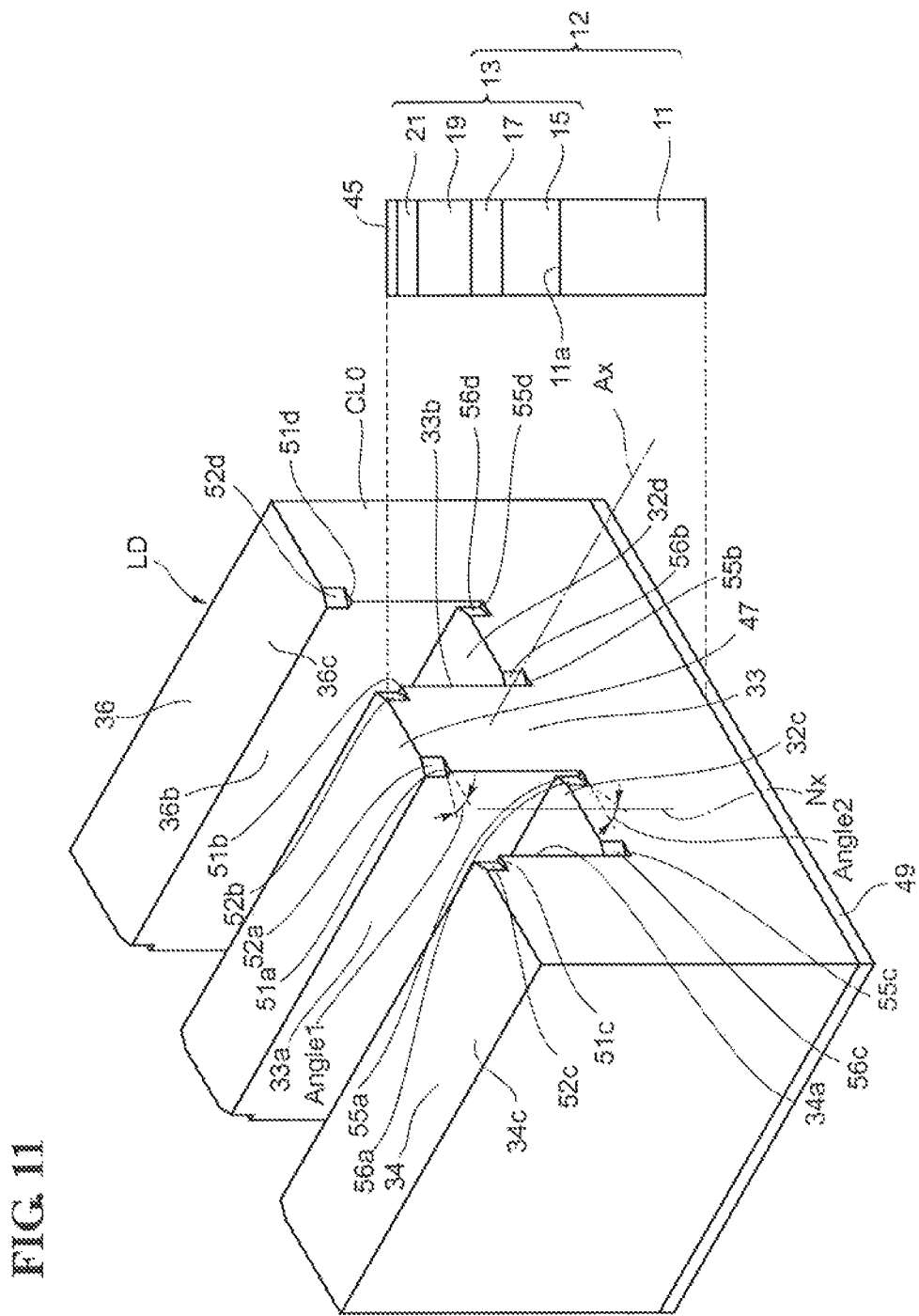
FIG. 11 is a diagram schematically illustrating the structure of a semiconductor optical device according to the present embodiment.

FIG. 11 is a diagram schematically showing the structure of a semiconductor optical device according to the present embodiment. Regarding FIG. 11, a laser diode LD is shown as a semiconductor optical device. The laser diode LD is provided with a cleavable substrate 11 and a stacked semiconductor layer 13. The substrate 11 is, for example, a III-V group compound semiconductor. The substrate 11 has the principal surface 11a with a (100) surface orientation. The stacked semiconductor layer 13 is epitaxially grown on the principal surface 11a of the substrate 11. The substrate 11 and the stacked semiconductor layer 13 constitute a cleavable semiconductor laminate 12. The semiconductor laminate 12 includes a base surfaces 32c and 32d and a waveguide mesa 33. The waveguide mesa 33 is protruded from the base surfaces 32c and 32d and is extended along the principal surface I 1a of the substrate II in an axis direction Ax intersecting the normal Nx to the base surfaces 32c and 32d. The waveguide mesa 33 includes a first cladding layer 15, an active layer (the core layer) 17, a second cladding layer 19, and a contact layer 21. The first cladding layer 15, the active layer (the core layer) 17, the second cladding layer 19, and the contact layer 21 arc arranged in the direction of the normal Nx to the base surfaces 32c and 32d. The semiconductor laminate 12 has a cleaved facet CL0 constituting a laser cavity of the laser diode concerned. The cleaved facet CL0 is extended intersecting the plane defined by the axis direction Ax and the normal direction Nx. The waveguide mesa 33 reaches the cleaved facet CL0. The waveguide mesa 33 includes a first side surface 33a and a second side surface 33b. The interval between the first side surface 33a and the second side surface 33b at the height of the active layer or the core layer is not changed regardless of formation of the marks. The laser diode. LD can be further provided with an electrode 47 disposed on the upper surface of the waveguide mesa 33 of the semiconductor laminate 12 and a protective film 45 covering the surface of the stacked semiconductor layer 13.

The semiconductor laminate 12 has dents 51a, 55a, 51b, and 55b. The dents 51a, 55a, 51b, and 55b are located on the cleaved facet CL0.

The dent 51a is extended, on the cleaved facet CL0, from the upper edge end of the first side surface 33a of the waveguide mesa 33 along the upper edge of the cleaved facet CL0. The side surface of the dent 51a has a component surface 52a extended along a reference plane inclined at an acute angle Angle 1 with respect to the cleaved facet CL0. In the present embodiment, the component surface 52a joins the side surface 33a to the cleaved facet CL0.

The dent 55a is extended, on the cleaved facet CL0, from the lower edge end of the first side surface 33a of the waveguide mesa 33 along the edge of the base surface 32c. The side surface of the dent 55a has a component surface 56a extended along a reference plane inclined at an acute angle Angle 2 with respect to the cleaved facet CL0. In the present embodiment, the component surface 56a joins the side surface 33a to the cleaved facet CL0.

The dent 51b is extended, on the cleaved facet CL0, from the upper edge end of the second side surface 33b of the waveguide mesa 33 along the upper edge of the cleaved facet CL0. The side surface of the dent 51b has a component surface 52b extended along a reference plane inclined at some acute angle with respect to the cleaved facet CL0. In the present embodiment, the component surface 52b joins the side surface 33b to the cleaved facet CL0.

The dent 55b is extended, on the cleaved facet CL0, from the lower edge end of the second side surface 33b of the waveguide mesa 33 along the edge of the base surface 32d. The side surface of the dent 55b has a component surface 56b extended along a reference plane inclined at some acute angle with respect to the cleaved facet CL0. In the present embodiment, the component surface 56b joins the side surface 33b to the cleaved facet CL0.

According to this laser diode LD, the dent 51a is extended from the upper edge end of one waveguide mesa side surface. Meanwhile, the dent 55a is extended from the lower edge end of this waveguide mesa side surface. The extension direction of the dent 51a is reverse to the extension direction of the dent 55a. Consequently, the starting point of the dent 51a on the upper surface of the waveguide mesa 33 and the starting point of the dent 55a on the base surface 32c are located on the same waveguide mesa side surface. In this regard, the extension direction of the dent 51a on the upper surface of the waveguide mesa 33 and the extension direction of the dent 55a on the base surface 32c are opposite to each other with respect to the waveguide mesa side surface.

The dent 51b is extended from the upper edge end of the other waveguide mesa side surface. Meanwhile, the dent 55b is extended from the lower edge end of this waveguide mesa side surface. The extension direction of the dent 51b is reverse to the extension direction of the dent 55b. Consequently, the starting point of the dent 51b on the upper surface of the waveguide mesa 33 and the starting point of the dent 55b on the base surface 32d are located on the same waveguide mesa side surface. In this regard, the extension direction of the dent 51b on the upper surface of the waveguide mesa 33 and the extension direction of the dent 55b on the base surface 32d are opposite to each other with respect to the waveguide mesa side surface.

Therefore, the dents 51a, 55a, 51b, and 55b are disposed along the same reference plane. Consequently, when the end facet in the vicinity of the waveguide mesa is produced, cleavage is performed along the extension directions of these dents. As a result, a cleavage surface along the predetermined cleavage line is provided in the vicinity of the waveguide mesa.

The semiconductor laminate 12 has a first groove 31a, a second groove 31b, a first terrace 34, and a second terrace 36. The first terrace 34 and the waveguide mesa 33 defines the first groove 31a, and the second terrace 36 and the waveguide mesa 33 define the second groove 31b. The first terrace 34 has a first terrace side surface 34a and a first terrace upper surface 34c. The second terrace 36 has a second terrace side surface 36b and a second terrace upper surface 36c.

The semiconductor laminate 12 has a dent 51c, a dent 55c, a dent 51d, and a dent 55d. The dent 51c, the dent 55c, the dent 51d, and the dent 55d are located on the cleaved facet CL0.

The dent 51c is extended, on the cleaved facet CL0, from the upper edge end of the side surface 34a of the first terrace 34 along the upper edge of the cleaved facet CL0. The side surface of the dent 51c has a component surface 52c extended along a reference plane inclined at some acute angle with respect to the cleaved facet CL0. In the present embodiment, the component surface 52c joins the side surface 34a to the cleaved facet CL0.

The dent 55c is extended, on the cleaved facet CL0, from the lower edge end of the side surface 34a of the first terrace 34 along the edge of the base surface 32c. The side surface of the dent 55c has a component surface 56c extended along a reference plane inclined at some acute angle with respect to the cleaved facet CL0. In the present embodiment, the component surface 56c joins the side surface 34a to the cleaved facet CL0.

The dent 51d is extended, on the cleaved facet CL0, from the upper edge end of the side surface 36b of the second terrace 36 along the upper edge of the cleaved facet CL0. The side surface of the dent 51d has a component surface 52d extended along a reference plane inclined at some acute angle with respect to the cleaved facet CL0. In the present embodiment, the component surface 52d joins the side surface 36b to the cleaved facet CL0.

The dent 55d is extended, on the cleaved facet CL0, from the lower edge end of the side surface 36b of the second terrace 36 along the edge of the base surface 32d. The side surface of the dent 55d has a component surface 56d extended along a reference plane inclined at some acute angle with respect to the cleaved facet CL0. In the present embodiment, the component surface 56d joins the side surface 36b to the cleaved facet CL0.

According to this laser diode LD, the dent 51c is extended from the upper edge end of one terrace side surface. Meanwhile, the dent 55c is extended from the lower edge end of this terrace side surface. The extension direction of the dent 51c is reverse to the extension direction of the dent 55c. Consequently, the starting point of the dent 51c on the upper surface of the terrace 34 and the starting point of the dent 55c on the base surface 32d are located on the same terrace side surface. In this regard, the extension direction of the dent 51c and the extension direction of the dent 55c on the base surface 32c are opposite to each other with respect to the terrace side surface.

The dent 51d is extended From the upper edge end of the other terrace side surface. Meanwhile, the dent 55d is extended from the lower edge end of this terrace side surface. The extension direction of the dent 51 d is reverse to the extension direction of the dent 55d. Consequently, the starting point of the dent 51d on the upper surface of the terrace 36 and the starting point of the dent 55d on the base surface 32d are located on the same waveguide mesa side surface. In this regard, the extension direction of the dent 51d on the upper surface of the terrace 36 and the extension direction of the dent 55d on the base surface 32d are opposite to each other with respect to the terrace side surface.

Therefore, the dents 51c, 55c, 51d, and 55d are disposed along the same reference plane. Consequently, when the end facet in the vicinity of the terrace is produced, cleavage is performed along the extension directions of these dents 51c, 55e, 51d, and 55d. As a result, a cleavage surface along the predetermined cleavage line is provided in the vicinity of the waveguide mesa.

As described above, when an edge type tool is pressed in from the back of the position of slitting, the substrate is cleaved from the position of slitting which serves as the starting point of cleaving. Cleavage is propagated in the inside of the substrate from the starting point. However, a cleavage line may be disturbed because the substrate product has some uneven surfaces, so that an end facet of the light-emitting portion may become out of the cleaved surface. As a result, lasing characteristics arc degraded. In particular, when a large difference is present between the cleavage direction and the crystal orientation, the influence is significant. Meanwhile, when dent marks are formed at a cleavage position of the waveguide mesa in advance during the wafer process, cleavage is performed easily by using the marks. Furthermore, it is known that cleavage is started from a scribed groove of the substrate and is propagated in the inside of the substrate, so as to reach the epitaxial crystal surface. Therefore, in the present embodiment, dent marks to guide cracking are disposed at the waveguide mesa. The dent marks are formed before the waveguide mesa is formed. The waveguide mesa is formed through dry etching. The dent marks are formed on both the upper surface and the bottom of the waveguide mesa. Even when the dent mark is added, the shape in the width direction of the waveguide mesa is not changed. At the process of forming the LD bar, a mechanical stress is applied by pushing a blade into the back along the desired direction of cleavage. Then, cleavage is started from a scribed groove disposed on the surface of the substrate product and at an end portion. The cleavage is propagated in the inside of the substrate and reaches the other surface, so that separation through cleavage is completed. When the cleavage approaches the waveguide mesa, the propagation direction is disturbed under the influence of the shape of the surface having an unevenness. In some cases, the cleaved surface of the light-emitting portion of the waveguide mesa is fluctuated and an uneven end facet is formed. As a result, an end facet of laser diode does not serve as a reflection mirror of the laser cavity. Therefore, lasing characteristics such as a threshold current, a slope efficiency and an optical output are degraded.

In the present invention, marks having angles (acute angle or obtuse angle) toward the cleavage guide direction (for example, a half rhombus) are formed as dents on the surface nearer to the substrate back surface than is the optical output portion of the waveguide mesa. That is, the marks are formed as dents on the upstream side of the cleavage line propagating from the start point into the inside of substrate. This dent is formed during the wafer process. Therefore, the side surface shape of the waveguide mesa is not changed even when the dent is formed. Consequently, an optical loss of an optical waveguide does not increase even when the marks having the dents are added. Furthermore, the waveguide mesa is cleaved more easily by addition of dents to the bottom of the first and the second grooves (trenches) 31a and 31b. When the cleavage reaches the vicinity of the waveguide mesa, initially, cracking occurs at the dents, and instability, e.g., a discrepancy in cleavage, is corrected. Subsequently, cleavage occurs in the inside of the waveguide mesa. Consequently, a smooth cleaved surface is formed in the optical output area of the cleaved surface. As a result, a device exhibiting good characteristics and a good yield can be produced.

Principles of the present invention have been described on the basis of preferred embodiments with reference to the drawings. However, those skilled in the art will understand that the embodiments can be changed in terms of details without departing from the principles. Therefore, all the modifications and changes within the scope and the spirit of Claims are claimed as the present invention.

What is claimed is:

1. A method for manufacturing a semiconductor optical device, comprising the steps of:
   growing a stacked semiconductor layer on a substrate having a cleavage direction in a first direction;
   forming a first mask having a plurality of openings arranged in the first direction on the stacked semiconductor layer;

forming a mark array by etching the stacked semiconductor layer using the first mask, the mark array including a first mark and a second mark;

after removing the first mask, forming a second mask having first and second openings extending in a second direction intersecting the first direction, the first opening having a first edge crossing the first mark, the second opening having a second edge crossing the second mark;

obtaining a substrate product by forming first and second grooves corresponding to the first and the second openings, respectively, and a waveguide mesa defined by the first and second grooves by etching the stacked semiconductor layer by using the second mask; and producing a laser diode bar by cleaving the substrate product including the first and the second grooves and the waveguide mesa, wherein, in the step of forming the first and second grooves, first and second residual marks are formed on the upper surface of the waveguide mesa, the first and the second residual marks being formed from a part of the first and the second marks, respectively, a first transfer mark is formed on the bottom of the first groove, the first transfer mark being formed by transferring from a part of the first mark, and a second transfer mark is formed on the bottom of the second groove, the second transfer mark being formed by transferring from a part of the second mark.

2. The method for manufacturing a semiconductor optical device, according to claim 1, wherein the stacked semiconductor layer includes a first cladding layer, a core layer, and a second cladding layer which constitute a waveguide structure.

3. The method for manufacturing a semiconductor optical device, according to claim 1, wherein the waveguide mesa has a width defined by an interval between the first edge of the first opening and the second edge of the second opening.

4. The method for manufacturing a semiconductor optical device, according to claim 1, wherein in the step of forming first and second grooves, the etching of the stacked semiconductor layer using the second mask is performed by a reactive ion etching method by using a gas mixture of $CH_4/H_2$ as an etchant.

5. The method for manufacturing a semiconductor optical device, according to claim 1, wherein the first mark has a portion partially exposed at the first opening and the second mask covers the remaining portion of the first mark, the second mark has a portion partially exposed at the second opening and the second mask covers the remaining portion of the second mark, the partially exposed portion of the-first mark has an angle toward the first direction and, in addition, the remaining portion of the first mark has an angle toward a third direction opposite to the first direction, and the partially exposed portion of the second mark has an angle toward the first direction and, in addition, the remaining portion of the second mark has an angle toward the third direction.

6. The method for manufacturing a semiconductor optical device, according to claim 1, wherein the laser diode bar has a cleaved surface, the first transfer mark and the second transfer mark are divided independently into first and second portions through the cleavage, the cleaved surface of the laser diode bar has the first portion of the first transfer mark and the first portion of the second transfer mark, the first residual mark and the second residual mark are divided independently into first and second portions through the cleavage, and the cleaved surface of the laser diode bar has the first portion of the first residual mark and the first portion of the second residual mark.

7. The method for manufacturing a semiconductor optical device, according to claim 1, wherein the mark array further includes a third mark and a fourth mark, the first opening has a third edge crossing the third mark in the mark array, the second opening has a fourth edge crossing a fourth mark in the mark array, the third edge of the first opening is farther from the second opening than is the first edge of the first opening, and the fourth edge of the second opening is farther from the first opening than is the second edge of the second opening.

8. The method for manufacturing a semiconductor optical device, according to claim 7, wherein, in the step of forming the first and the second grooves, first and second terraces are formed, the first terrace and the waveguide mesa define the first groove, the second terrace and the waveguide mesa define the second groove, third and fourth residual marks are formed on the upper surfaces of the first and the second terraces, respectively, the third and the fourth residual marks being formed from a part of the third and the fourth marks, respectively, a third transfer mark is formed on the bottom of the first groove, the third transfer mark being formed by transferring from a part of the third mark, and a fourth transfer mark is formed on the bottom of the second groove, the fourth transfer mark being formed by transferring a part of the fourth mark.

9. The method for manufacturing a semiconductor optical device, according to claim 1, the method further comprising the step of forming a groove by scribing the surface of the stacked semiconductor layer in accordance with the mark array before cleaving the substrate product, wherein the scribed groove has a depth larger than the depths of the first and the second marks.

10. The method for manufacturing a semiconductor optical device, according to claim 1, wherein the first and the second marks have depths of 250 nm or more.

11. The method for manufacturing a semiconductor optical device, according to claim 1, the method further comprising the step of forming an insulating layer on the first and the second residual marks and the first and the second transfer marks alter forming the first and the second grooves and before cleaving the substrate product.

12. The method for manufacturing a semiconductor optical device, according to claim 11, the method further comprising the steps of:

forming an opening in the insulating layer located on the upper surface of the waveguide mesa; and forming a first electrode in contact with the waveguide mesa through the opening before cleaving the substrate product.

* * * * *